United States Patent [19]
Bakhmutsky

[11] Patent Number: 5,835,035
[45] Date of Patent: Nov. 10, 1998

[54] HIGH PERFORMANCE VARIABLE LENGTH DECODER WITH TWO-WORD BIT STREAM SEGMENTATION AND RELATED METHOD

[75] Inventor: Michael Bakhmutsky, Spring Valley, N.Y.

[73] Assignee: Philips Electronics North America Corporation, New York, N.Y.

[21] Appl. No.: 926,669

[22] Filed: Sep. 9, 1997

Related U.S. Application Data

[63] Continuation of Ser. No. 672,246, Jun. 28, 1996, abandoned, which is a continuation-in-part of Ser. No. 583,149, Dec. 28, 1995, Pat. No. 5,657,016.

[51] Int. Cl.$^6$ ............................................. H03M 7/40
[52] U.S. Cl. ........................................... 341/67; 341/106
[58] Field of Search .................................. 341/51, 67, 79, 341/106, 107

[56] References Cited

U.S. PATENT DOCUMENTS

| | | |
|---|---|---|
| 5,173,695 | 12/1992 | Sun et al. . |
| 5,225,832 | 7/1993 | Wang et al. ................................ 341/67 |
| 5,541,595 | 7/1996 | Meyer ........................................ 341/67 |
| 5,557,271 | 9/1996 | Rim et al. .................................. 341/67 |
| 5,561,690 | 10/1996 | Park ......................................... 375/340 |
| 5,572,208 | 11/1996 | Wu ............................................ 341/67 |
| 5,617,089 | 4/1997 | Kinouchi et al. .......................... 341/65 |
| 5,623,262 | 4/1997 | Normile et al. ........................... 341/67 |
| 5,625,355 | 4/1997 | Takeno et al. ............................. 341/67 |
| 5,638,069 | 6/1997 | Rensink et al. ........................... 341/67 |
| 5,642,114 | 6/1997 | Komoto et al. ........................... 341/67 |
| 5,646,618 | 7/1997 | Walsh ........................................ 341/67 |
| 5,650,781 | 7/1997 | Park ........................................... 341/67 |
| 5,650,905 | 7/1997 | Bakhmutsky . |
| 5,666,115 | 9/1997 | Colavin ..................................... 341/67 |
| 5,668,548 | 9/1997 | Bakhmutsky . |
| 5,675,332 | 10/1997 | Limberg ................................... 341/67 |
| 5,682,156 | 10/1997 | Suda ......................................... 341/67 |
| 5,696,506 | 12/1997 | Yu ............................................. 341/67 |
| 5,696,507 | 12/1997 | Nam .......................................... 341/67 |
| 5,701,926 | 12/1997 | Kim .......................................... 341/67 |
| 5,714,950 | 2/1998 | Jeong et al. .............................. 341/67 |
| 5,736,946 | 4/1998 | Sohn ......................................... 341/67 |

Primary Examiner—Marc S. Hoff
Assistant Examiner—Jason L. W. Kost
Attorney, Agent, or Firm—Laurie E. Gathman

[57] ABSTRACT

A variable length decoder (VLD) for processing an input bit stream (e.g., MPEG video) which includes qualifying and non-qualifying types of variable length code words. The VLD includes an input circuit for receiving the input bit stream and providing a sequence of available input bits, a shifter circuit for providing a decoding window that includes one or more code words contained in the sequence of available input bits, a code word length decoding circuit for determining whether or not the decoding window contains a pair of qualifying code words, and for determining the combined length of the pair of qualifying code words and producing a combined length signal representative of the determined combined length, if the decoding window contains a pair of qualifying code words, and further, for determining the length of a leading code word contained in the decoding window and producing a leading word length signal representative of the determined length of the leading code word. The VLD also includes a computation loop circuit for generating a word pointer signal, in response to the combined length signal if it is determined that the decoding window contains a pair of qualifying code words, or otherwise, in response to the leading word length signal. The shifter circuit is responsive to the word pointer signal for shifting the decoding window across the sequence of available input bits. A related method is also disclosed.

38 Claims, 3 Drawing Sheets

HIGH PERFORMANCE VARIABLE LENGTH DECODER WITH TWO-WORD BIT STREAM SEGMENTATION AND RELATED METHOD

This is a continuation of application Ser. No. 08/672,246, filed Jun. 28, 1996, abandoned, which is a continuation-in-part of application Ser. No. 08/583,149 filed Dec. 28, 1995, now U.S. Pat. No. 5,657,016 issued Aug. 12, 1997.

BACKGROUND OF THE INVENTION

The present invention relates generally to variable length decoders used in data transmission systems, and more particularly, to a variable length decoder (and related method) for decoding digital video data for high definition television (HDTV).

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, however, where the peak symbol rate is about 100 million code words per second, decoding the whole picture at the symbol rate with a single variable length decoder becomes impractical. In HDTV systems, the variable length decoder (VLD) is used to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol, a VLD throughput of 100 million or more code words per second is required. In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs may require eight ping-pong buffers, each one of the ping-pong buffers being twice the size of the rate buffer, thereby increasing the amount of required buffer memory by a factor of sixteen over a system having a single VLD.

In HDTV systems, the input bit stream is normally an MPEG digital video data stream which includes payload data and setup data. The payload data, which constitutes the overwhelming majority of the data (about 95% of the data), is represented by contiguous code words such as DCT (discrete cosine transform) coefficients and motion vectors, which are decoded using their respective look-up tables. The setup data, which constitutes the remaining portion of the data (about 5% of the data), is represented by singular code words which are decoded using different look-up tables.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data, but at a lower clock rate, thereby enabling the use of cheaper (slower) memory and making more practical the implementation of the variable length decoder.

To fulfill this need in the art, and increase the data throughput, a variable length decoder capable of pre-tagging the input bit stream and parallel processing contiguous code words of identical type was developed and disclosed in a co-pending U.S. patent application entitled "HIGH PERFORMANCE VARIABLE LENGTH DECODER WITH ENHANCED THROUGHPUT DUE TO TAGGING OF THE INPUT BIT STREAM AND PARALLEL PROCESSING OF CONTIGUOUS CODE WORDS," by M. Bakhmutsky (the present inventor), Ser. No. 08/580,405, filed Dec. 28, 1995, the teachings of which are herein incorporated by reference. Although the variable length decoder disclosed in the above-referenced application constitutes an excellent solution for both higher throughput and lower clock rate, the overhead of both the tree-searching pre-tagging circuit and the additional buffer memory of the same size as the rate buffer result in a product cost which may be prohibitive for at least some consumer HDTV decoders. Thus, the cost of this variable length decoder constitutes a shortcoming thereof.

Accordingly, a high performance variable length decoder meeting these stringent requirements for a consumer HDTV decoder was developed and disclosed in a co-pending U.S. patent application entitled "VARIABLE LENGTH DECODER WITH ADAPTIVE ACCELERATION IN PROCESSING OF HUFFMAN ENCODED BIT STREAMS", by M. Bakhmutsky (the present inventor), Ser. No. 08/580,407, filed Dec. 28, 1995, the teachings of which are herein incorporated by reference. The throughput per clock cycle of the variable length decoder disclosed in this application is adaptively increased for a selected group of code words in the Huffman encoded input bit stream which have a bit length less than a prescribed number, by decoding combinations of two or more code words from the selected group, during a single clock cycle, using a combination value look-up table. Since the code words in the selected group are the statistically most frequently occuring code words in the Huffman encoded input bit stream, the variable length decoder is able to process an entire picture at a reduced clock rate, without sacrificing throughput. Thus, improved statistical performance is attained due to adaptive acceleration in processing code words in the selected group. However, while this statistical performance enhancement mechanism guarantees a higher average minimum code word length for an entire picture, it does not guarantee that picture elements smaller than the size of the entire picture may have high code word peak rates. The inability to guarantee high performace with regard to local activity constitutes a shortcoming of this variable length decoder, since it could impair real-time picture processing. Good handling of local activity is vital for real-time picture processing performed without unnecessary overhead in picture memory.

Hence, a need exists in the art for a variable length decoder which has performance comparable to that of the above-referenced high-speed variable length decoders, but which overcomes the shortcomings thereof. The present invention fulfills this need in the art.

SUMMARY OF THE INVENTION

The present invention encompasses a variable length decoder for processing an input bit stream (e.g., an MPEG digital video bit stream) which includes a plurality of qualifying and non-qualifying types of variable length code words. The terminology "qualifying" and "non-qualifying" types of code words as used hereinthroughout shall mean code words which are of a type which either qualify or do not qualify, respectively, for possible parallel processing. The variable length decoder includes an input circuit for receiving the input bit stream and providing a sequence of available input bits, a shifter circuit for providing a decoding window that includes one or more code words contained in the sequence of available input bits, a code word length decoding circuit for determining whether or not the decoding window contains a plural number N (preferably two) of qualifying code words, where $N \geq 2$, and for determining the combined length of the plural number N of qualifying code words and producing a combined length signal representative of the determined combined length, if it is determined that the decoding window contains N qualifying code words, and further, for determining the length of a leading code word contained in the decoding window and producing a leading word length signal representative of the determined length of the leading code word.

The variable length decoder also includes a computation loop circuit for generating a word pointer signal, in response to the combined length signal if it is determined that the decoding window contains N qualifying code words, or otherwise (i.e., the decoding window only contains <N qualifying code words or a non-qualifying code word(s)), in response to the leading word length signal. The shifter circuit is responsive to the word pointer signal for shifting the decoding window across the sequence of available input bits.

The variable length decoder preferably further includes a code word value decoding circuit for decoding the values of the one or more code words contained in the decoding window. The code word length decoding circuit preferably includes a prefix combination table for determining the combined length of N qualifying code words contained in the decoding window, and a word length table for determining the length of a leading code word contained in the decoding window.

The computation loop circuit preferably includes a multiplexer which has a first input for receiving the leading word length signal, a second input for receiving the combined length signal, a control input for receiving a control signal indicative of whether or not the decoding window includes N qualifying code words. The multiplexer is responsive to the control signal for outputting either the leading word length signal or the combined length signal. The computation loop circuit preferably further includes an adder-accumulator circuit responsive to either the leading word length signal or the combined length signal, whichever is outputted by the multiplexer, for producing the word pointer signal.

In another of its aspects, the present invention encompasses a method for processing an input bit stream (e.g., an MPEG digital video bit stream) which includes a plurality of qualifying and non-qualifying types of variable length code words, including the steps of providing a sequence of available input bits, providing a decoding window that includes one or more code words contained in the sequence of available input bits, and determining whether or not the decoding window contains a plural number N (preferably two) of qualifying code words, where $N \geq 2$, and if it is determined that the decoding window contains N qualifying code words, then determining the combined length of the N qualifying code words, producing a combined length signal representative of the determined combined length, and shifting the decoding window across the sequence of available input bits in response to the combined length signal.

The method further includes the steps of determining the length of a leading code word contained in the decoding window, and producing a leading word length signal representative of the determined length of the leading code word, and, if it is determined that the decoding window does not contain N qualifying code words, then shifting the decoding window across the sequence of available input bits in response to the leading word length signal.

The method preferably further includes the step of decoding the values of the one or more code words contained in the decoding window.

BRIEF DESCRIPTION OF THE DRAWINGS

These and other objects, features, and advantages of the present invention will be readily understood from the following detailed description taken in conjunction with the accompanying drawings, in which.

DETAILED DESCRIPTION OF THE INVENTION

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the present invention would be of significant utility.

In overview, the present invention relates to a high-performance, low-cost variable length decoder (VLD) which provides at least two-word rather than one-word bit stream segmentation for all or almost all code words of a qualifying type, e.g., all DCT coefficients and motion vectors (payload data—which constitutes approximately 95% of an MPEG-2 bit stream), in order to reduce the complexity and memory requirements of the VLD. More particularly, the prefixes of each pair (or other plural number $N \geq 2$) of qualifying code words in the bit stream are combined, and the combined length of each such pair is decoded using a prefix combination look-up table (for each type of qualified code word) which contains a separate prefix combination entry for each possible two-word prefix combination (for that type of qualified code word). The decoded combined length is then applied to the adder-accumulator circuit of the timing-critical word length decoding loop in order to increment the pointer register of the adder-accumulator circuit by the decoded combined word length, to thereby shift the decoding window of the barrel shifter across the sequence of available bits of the registered input bit stream by the appropriate amount for the next code word(s) to be decoded by the VLD. The code word value decoding process is not timing critical because it is performed outside of the length decoding loop.

Figure 1:
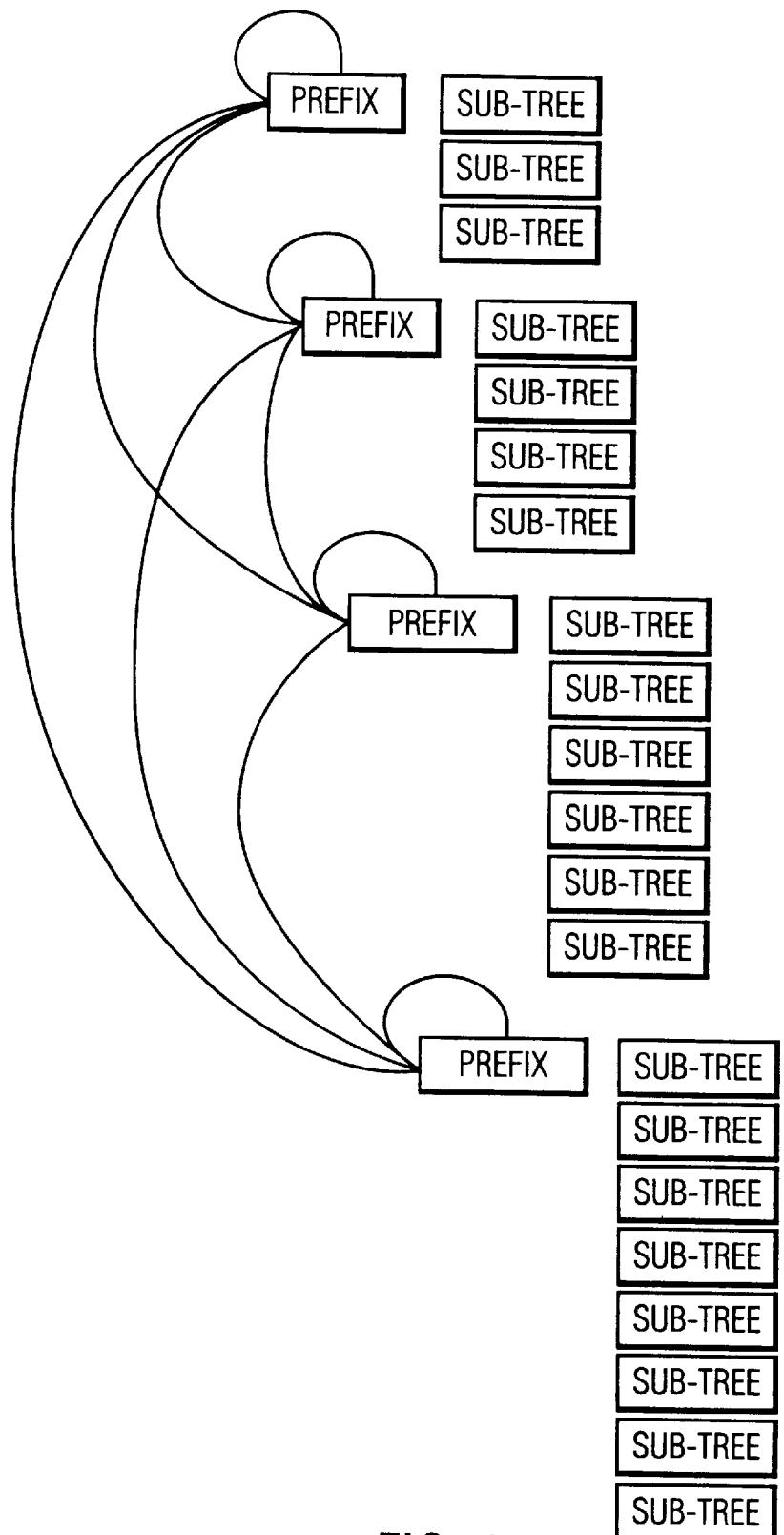
FIG. 1 is a diagram depicting the principle of grouping code words by prefix in a Huffman table.

It will be appreciated that the number of variable length codes in a particular variable length coding (VLC) table can be very large. For example, the MPEG-2 DCT coefficient table zero contains 114 variable length codes. Thus, there would be $114^2$ possible two-word combinations of these unique variable length codes, which would render two-word bit stream segmentation by combining all of these unique codes impractical. However, in the construction of any complex Huffman coding table (such as the MPEG variable length coding tables), and the above table in particular, a unique prefix is normally shared by multiple sub-trees in code words of the same bit length. For example, with reference to FIG. 1, all code words of the same bit length (but having different values) share the same prefix (which defines the length of these code words). Thus, for the example illustrated in FIG. 1, there are four different prefixes corresponding to four different possible code word bit lengths. For each prefix, there are multiple code words of the same bit length, but having different values, as represented by the sub-trees. The above-mentioned MPEG-2 DCT coefficient table zero actually has only 14 length possibilities fully defined by 14 respective unique prefixes. Thus, combining all possible two-word combinations of this type of code word (i.e., DCT coefficients) by their prefixes for the purpose of two-word bit stream segmentation is quite feasible, because decoding the smaller number ($14^2$) of possible two-word prefix combinations using a single decoding table is manageable.

Figure 2:
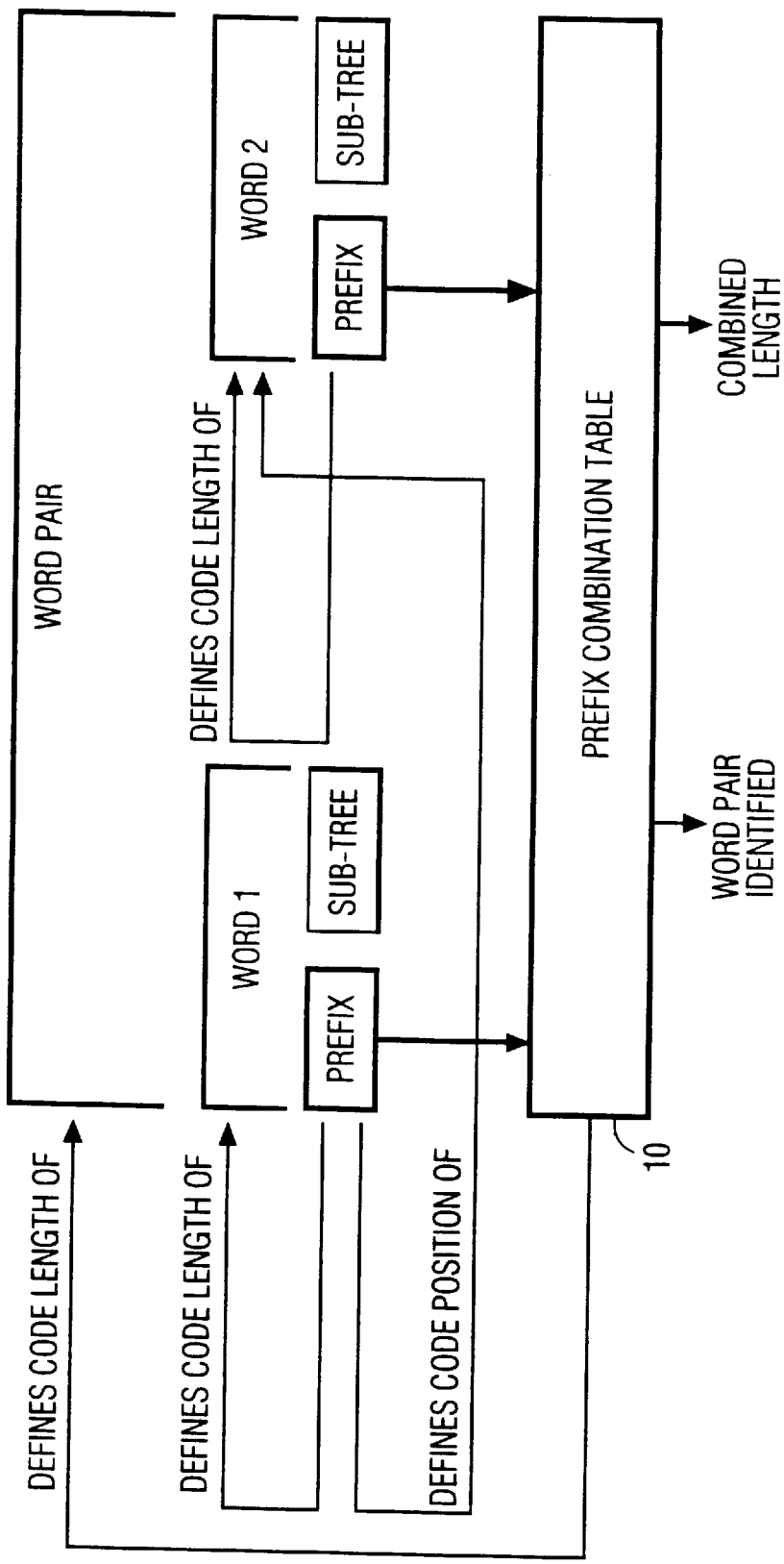
FIG. 2 is a block diagram illustrating the principle of table identification of code word pairs; and, FIG. 3 is a block diagram of an illustrative embodiment of the variable length decoder of the present invention.

With reference now to FIG. 2, the principle of table identification of code word pairs will now be described. More particularly, the bit lengths of two code words WORD 1 and WORD 2 which belong to the same coding table (i.e., of the same code word type), are uniquely identified by their respective prefixes. The prefix of WORD 1 defines both the code length of WORD 1 and the code position of the prefix of WORD 2. The prefix of WORD 2 defines the code length of WORD 2. If both WORD 1 and WORD 2 are included in the prefix combination table 10, the presence of the valid combination is flagged by outputting a "Word Pair Identified" signal. At the same time, the combined length of the code word pair (length of WORD 1+length of WORD 2) is looked-up in the prefix combination table 10, and the looked-up (decoded) combined word length ("Combined Length") is outputted. This table look-up identification of code word pairs by prefixes enables two-word bit stream segmentation, which eliminates the necessity of using a chain of barrel shifters and adders in the timing critical word length decoding loop. In practice, performance (speed and throughput) comparable to that of the VLD disclosed in the above-referenced co-pending application Ser. No. 08/580, 405 can be achieved without utilizing any additional memory and without the need for a pre-VLD.

Figure 3:
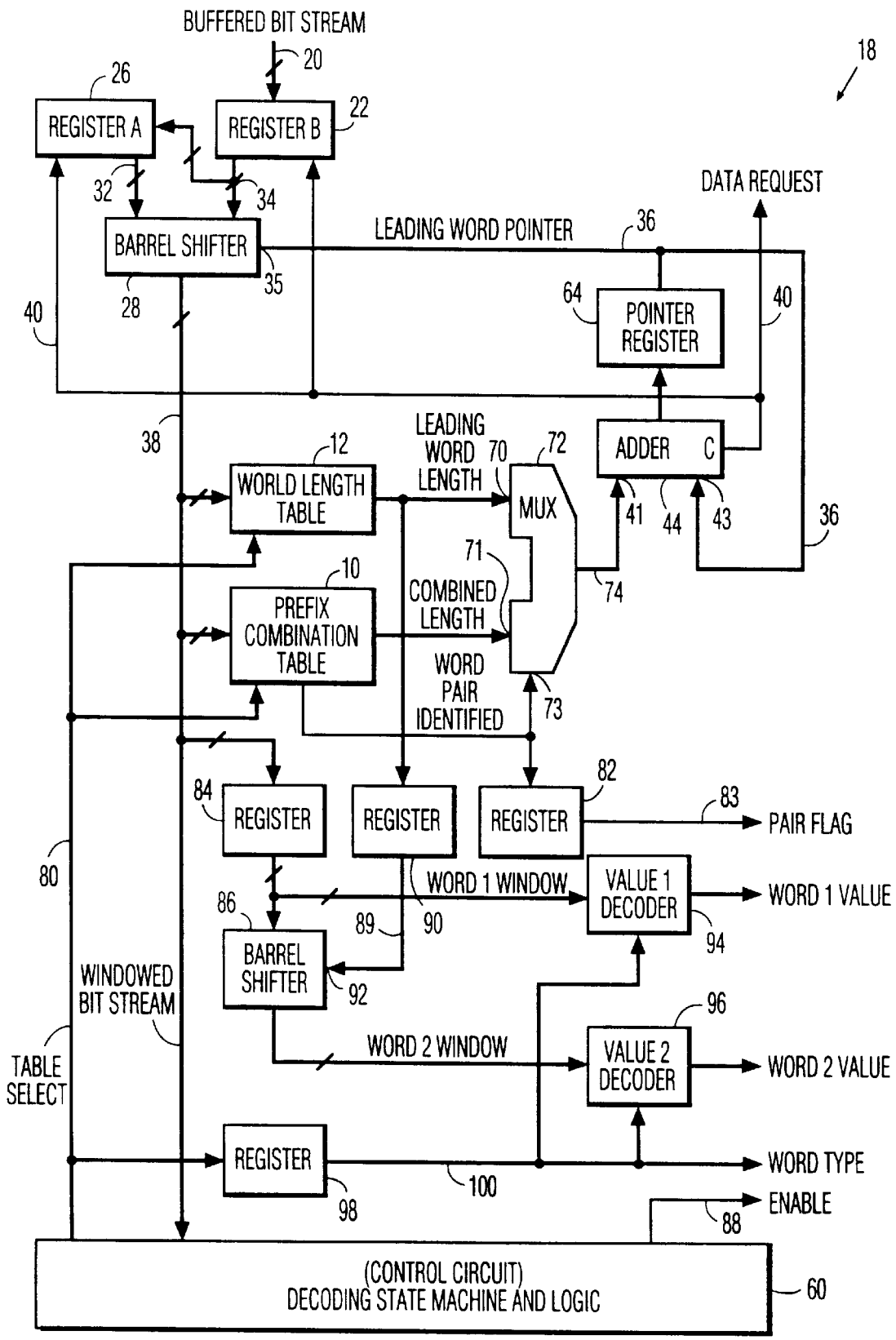

With reference now to FIG. 3, there can be seen a block diagram of a variable length decoder 18 constructed in accordance with a presently preferred embodiment of the present invention. An input bit stream 20 from a rate buffer (not shown) includes a sequence of variable length code words. The input bit stream 20 is received by a first register 22. In the present specific embodiment, the input bit stream 20 is an MPEG digital video data stream which includes payload data and setup data. The payload data, which constitutes the overwhelming majority of the data (about 95% of the data), are represented by such code words as DCT (discrete cosine transform) coefficients and motion vectors, which are decoded using their respective look-up tables. The setup data, which constitutes the remaining portion of the data (about 5% of the data), are represented by other code word types, and are decoded using different look-up tables. The setup data is used by a control circuit 60 comprised of a decoding state machine and associated logic circuitry for directing the decoding process, in accordance with the MPEG decoding protocol.

As previously discussed, the MPEG digital video data stream (input bit stream 20) is a Huffman-encoded bit stream which contains different types of variable length code words. Each of the qualifying types of code words (i.e., code word types qualified for parallel processing) includes a prefix which defines its bit length. Code words of the same type (i.e., belonging to the same coding table) and length, but having different values, share the same prefix.

In accordance with the present invention, the code word types corresponding to the payload data are selected to be qualifying code word types, and the code word types corresponding to the setup data are selected to be non-qualifying code word types. As will be described more fully hereinafter, when the "word pair identified" signal output by the prefix combination (look-up) table 10 indicates that the currently decoded input bits of the input bit stream 20 within the output decoding window (i.e., the "windowed bit stream") includes a pair of qualifying code words, then the combined length of that pair of qualifying code words is detected using the prefix combination table 10 (constructed in the manner discussed above in connection with FIG. 2), and the detected combined length is then used to update the leading word pointer which is used to shift the decoding window by the appropriate amount. If it is determined (by the control circuit 60) that the windowed bit stream contains a non-qualifying code word or the "word pair identified" signal output by the prefix combination table 10 indicates that the windowed bit stream includes only a single qualifying code word (as opposed to a pair of qualifying code words), then the length of the code word is detected in the conventional manner using a standard word length (look-up) table 12 corresponding to the detected code word type, under control of the "table select" signal output by the control circuit 60 and the "word pair identified" signal output by the prefix combination table 10.

The first register 22 is connected to a barrel shifter 28 via thirty-two (32) parallel input bit lines 34, each line corresponding to a bit in the first register 22. The second register 26 is connected to the barrel shifter 28 via thirty-two (32) parallel input bit lines 32, each line corresponding to a bit in the second register 26. Thus, a total of sixty-four (64) parallel input bit lines 32, 34 are connected to the barrel shifter 28, thereby providing a corresponding sequence of 64 available input bits for the barrel shifter 28. The barrel shifter 28 has a shift input 35 and thirty-two (32) parallel output bit lines 38. Those skilled in the art will appreciate that other numbers of parallel input bit lines 32, 34 and parallel output bit lines 38 may be utilized without departing from the spirit and scope of the present invention. In the present specific embodiment, the number of parallel input bit lines 32, the number of parallel input bit lines 34, and the number of parallel output bit lines 38 are each chosen to be equal in number to the maximum number of bits in a code word (i.e., maximum code word length).

Initially, in response to a data request signal applied over a data request line 40, a sequence of thirty-two bits representing code words to be decoded is loaded into the first register 22 from the input bit stream 20, while the contents of the first register 22 are transferred to the second register 26 over thirty-two (32) parallel bit lines 24. Thus, a sequence of sixty-four input bits is available to the barrel shifter 28. The thirty-two parallel output bit lines 38 are chosen from the sixty-four parallel input bit lines 32, 34 in a manner discussed below, to thereby provide a decoding window 38 ("windowed bit stream").

The decoding window or windowed bit stream 38 is shifted from left to right across the sequence of available input bits in response to a leading word pointer applied over a line 36 to the shift input 35 of the barrel shifter 28. The decoding window 38 is shifted by the word pointer across the sequence of available input bits according to the length (or combined length) of the code word(s) decoded during a previous clock cycle, so that the start of a next code word(s) to be processed during the current clock cycle begins at the left edge of the decoding window 38.

The value of the leading word pointer applied over the line 36 is summed by an adder 44 with the decoded length or combined length(s) of the code word(s) decoded during a current clock cycle, which is represented by the output of a multiplexer 72 applied over a line 74 to a first input 41 of the adder 44, the leading word pointer being applied over the line 36 to a second input 43 of the adder 44. The output of the adder 44 (which can be considered the "updated leading word pointer") is loaded into a pointer register 64, the output of which is the leading word pointer. (Of course, when the system is initialized, the pointer register 64 is initialized to zero.)

When the sum of the current value of the leading word pointer plus the decoded length or combined length(s) of the code word(s) decoded during the current clock cycle (hereinafter referred to as the "loop sum") exceeds the bit width of the decoding window 38 (i.e., thirty-two in the present specific embodiment), the adder 44 overflows or loops around "0", and generates a carry output "C" which is applied to the data request line 40, thus triggering a "data reload" operation, in which the contents of the first register 22 are transferred to the second register 26, and the next sequence of thirty-two bits from the input bit stream 20 are loaded into the first register 22. When the adder 44 overflows, the output value of the adder 44 is equal to the amount by which the "loop sum" exceeds thirty-two (i.e., "loop sum" minus 32). Thus, the updated leading word pointer registered in the pointer register 64 is equal to this difference, and accordingly, the leading word pointer output by the pointer register 64 shifts the left edge of the decoding window 38 to the input bit (of the sequence of available input bits) whose bit position number is equal to this difference. For example, if the "loop sum" is forty, then the output of the adder is eight, and thus, the word pointer will shift the left edge of the decoding window 38 to the eighth available input bit.

The decoding window or windowed bit stream 38 is input to the control circuit 60 and to both the prefix combination table 10 and the word length table 12. The word length table 12 decodes the length of the leading code word contained in the windowed bit stream 38, in the normal manner, and outputs a "leading word length" signal whose value represents the decoded length of the leading code word. The "leading word length" signal is applied to a first input 70 of the multiplexer 72. The prefix combination table 10 decodes the combined length of a pair of qualifying code words, if any, contained in the windowed bit stream 38, and outputs a "combined length" signal whose value represents the combined bit length of the qualified code word pair. The "combined length" signal is applied to a second input 71 of the multiplexer 72.

The control circuit 60 monitors the windowed bit stream 38 and executes the decoding protocol in order to identify the type(s) of code word(s) which are contained in the windowed bit stream 38 (based upon previous and current decoding results). The control circuit 60 outputs a "table select" signal over a line 80 for selecting the proper look-up table within all of the decoding circuits.

The "table select" signal applied over the line 80 is applied as input to the prefix combination table 10. If the "table select" signal output by the control circuit 60 over line 80 indicates that the windowed bit stream 38 includes a qualifying code word, and the prefix combination table 10 detects a pair of qualifying code words in the windowed bit stream 38, then the "word pair identified" signal output by the prefix combination table 10 over line 73 is set to a first logic state (e.g., logic high level) which indicates that the windowed bit stream 38 contains a pair of qualifying code words (referred to as a "combined length decoding mode"). On the other hand, if either the "table select" signal output by the control circuit 60 over line 80 indicates that the windowed bit stream 38 includes a non-qualifying code word, or the prefix combination table 10 does not detect a pair of qualifying code words in the windowed bit stream 38 (e.g., if the windowed bit stream 38 contains only a single qualifying code word), then the "word pair identified" output by the prefix combination table 10 is set to a second logic state (e.g., logic low level) which indicates that the windowed bit stream 38 does not contain a pair of qualifying code words (referred to as the "single (or standard) word length decoding mode").

The "word pair identified" signal is applied to the control or select input 73 of the multiplexer 72 and is registered by a register 82. If the "word pair identified" signal is in its first logic state, indicating that the VLD 18 is in the combined length decoding mode, then the output "combined length" of the prefix combination table 10 is selected as the output of the multiplexer 72 and applied over the line 74 to the first input 41 of the adder 44 for use in updating the "leading word pointer" applied over the line 36 to the shift input 35 of the barrel shifter 28. On the other hand, if the "word pair identified" signal is in its second logic state, indicating that the VLD 18 is in the single word length decoding mode, then the output "leading word length" of the word length table 12 is selected as the output of the multiplexer 72 and applied over the line 74 to the first input 41 of the adder 44 for use in updating the "leading word pointer" applied over the line 36 to the shift input 35 of the barrel shifter 28. The registered "word pair identified" signal is output by the register 82 over the line 83 as a "pair flag" which indicates whether one or two code words are currently present at the VLD output.

The windowed bit stream 38 is registered by a register 84, and the registered window bit stream "word 1 window" output by the register 84 is applied to both a barrel shifter 86 and to a value 1 decoder 94. The "leading word length" signal output by the word length table 12 is applied to a register 90, and the registered "leading word length" signal is applied over a line 89 to a shift input 92 of the barrel shifter 86, to thereby shift the output decoding window of the barrel shifter 86 to the start of the second code word (if any) in the registered window bit stream output by the register 84. The windowed bit stream output "word 2 window" of the barrel shifter 86 is applied to a value 2 decoder 96.

The "table select" signal output by the control circuit 60 is registered by a register 98, and the registered "table select" signal output by the register 98 is applied to respective table select inputs of the value 1 and value 2 decoders 94, 96, to thereby select the proper look-up table for decoding the values of the first code word and second code word (if any), respectively, contained within the windowed bit stream 38. The output of register 98 is applied over line 100 to the VLD output to identify the code word type presented at the outputs of the value 1 and value 2 decoders 94, 96. The control circuit 60 also outputs an "enable" signal over a line 88 validating the current output state.

The above-described method and VLD architecture of the present invention provide several advantages over prior solutions. As previously mentioned, high performance at lower clock rates of operation can be achieved without the extra expense of added hardware complexity and additional memory, thereby rendering this invention very suitable for consumer digital HDTV decoders. Another advantage of the present invention is that is provides good handling of local activity in terms of code word peak rates, thereby overcoming the previously described shortcoming of the VLD disclosed in the co-pending application Ser. No. Ser. No. 08/580,407. The capability of the VLD of the present invention to handle peak rates locally is achieved by combining all code words by their prefixes in the prefix combination table, and then using the prefix combination table to achieve two-word bit stream segmentation, as opposed to one-word bit stream segmentation (as done in the previously developed VLDs). As mentioned, good handling of local activity is very important for subsequent real-time picture processing.

In general, although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims. For example, although the presently preferred embodiment has been described in terms of the specific case of two-word bit stream segmentation, it should be appreciated that the present invention broadly encompasses N-word bit stream segmentation, where N≧2 (e.g., N could be prescribed to be 3 or more).

What is claimed is:

1. A method for processing an input bit stream which includes a plurality of qualifying and non-qualifying types of variable length code words, by multi-word bit stream segmentation, including the steps of:

provide a sequence of available input bits;

providing a decoding window that includes one or more code words contained in said sequence of available input bits;

determining whether or not said decoding window contains a prescribed plural number N of qualifying code words, where N≧2;

if it is determined that said decoding window contains N qualifying code words, then determining the combined length of the N qualifying code words, producing a combined length signal representative of the determined combined length, and shifting said decoding window across said sequence of available input bits in response to said combined length signal;

determining the length of a leading code word contained in said decoding window, and producing a leading word length signal representative of the determined length of the leading code word; and, if it is determined that said decoding window does not contain N qualifying code words, then shifting the decoding window across said sequence of available input bits in response to said leading word length signal.

2. The method as set forth in claim 1, wherein the input bit stream comprises a Huffman-encoded bit stream which contains different types of variable length code words each of which includes a prefix which defines its bit length, wherein code words of the same type and same bit length, but having different values, have the same prefix.

3. The method as set forth in claim 2, wherein the step of determining the combined length is carried out by using a prefix combination table.

4. The method as set forth in claim 3, wherein said prefix combination table contains entries corresponding to all possible N-word combinations of the prefixes of the code words of a qualifying type.

5. The method as set forth in claim 1, further comprising the step of decoding the values of said one or more code words contained in said decoding window.

6. The method as set forth in claim 1, wherein the input bit stream comprises an MPEG digital video bit stream.

7. The method as set forth in claim 1, wherein the step of determining the combined length is carried out by using a prefix combination table.

8. The method as set forth in claim 1, wherein said qualifying code words comprise code word types corresponding to payload data of an MPEG digital video bit stream.

9. The method as set forth in claim 1, wherein the non-qualifying types of code words comprise code word types corresponding to setup data of an MPEG digital video bit stream.

10. The method as set forth in claim 1, wherein said N qualifying code words comprises N contiguous code words of the qualifying type which belong to a common coding table.

11. A variable length decoder for processing an input bit stream which includes a plurality of qualifying and non-qualifying types of variable length code words, by multi-word bit stream segmentation, comprising:
   input means for receiving the input bit stream and providing a sequence of available input bits;
   shifter means for providing a decoding window that includes one or more code words contained in said sequence of available input bits;
   code word length decoding means for determining whether or not said decoding window contains a prescribed plural number N of qualifying code words, wherein N≧2, and for determining the combined length of the N qualifying code words and producing a combined length signal representative of the determined combined length, if it is determined that said decoding window contains N qualifying code words, and further, for determining the length of a leading code word contained in said decoding window and producing a leading word length signal representative of the determined length of the leading code word; and,
   computation loop means for generating a word pointer signal, in response to either said combined length signal, if it is determined that said decoding window contains N qualifying code words, or otherwise, in response to said leading word length signal, said shifter means being responsive to said word pointer signal for shifting said decoding window across said sequence of available input bits.

12. The variable length decoder as set forth in claim 11, further including code word value decoding means for decoding the values of said one or more code words contained in said decoding window.

13. The variable length decoder as set forth in claim 12, further including control means for determining the types of code words currently being decoded based upon previous and current decoding results, and for generating a table select signal indicative of the determined type of the code word(s) currently being decoded.

14. The variable length decoder as set forth in claim 13, wherein said code word length decoding means and said code word value decoding means are each responsive to said table select signal for selecting an appropriate coding table for decoding the length and value of the code word(s) currently being decoded, respectively.

15. The variable length decoder as set forth in claim 12, wherein said code word value decoding means includes:
   a first register coupled to said decoding window for registering input bits included within said decoding window and outputting a registered first word window;
   a first code word value decoder coupled to said registered first word window for decoding the value of a first code word contained in said decoding window;
   a barrel shifter coupled to said registered first word window and outputting a second word window, said barrel shifter having a shift input coupled to said leading word length signal, said barrel shifter being responsive to said leading word length signal for shifting said second word window across a sequence of available bits included within said registered first word window; and,
   a second code word value decoder coupled to said second word window for decoding the value of a second code word, if any, contained in said decoding window.

16. The variable length decoder as set forth in claim 11, wherein the input bit stream comprises a Huffman-encoded bit stream which contains different types of variable length code words each of which includes a prefix which defines its bit length, wherein code words of the same type and same bit length, but having different values, have the same prefix.

17. The variable length decoder as set forth in claim 16, wherein said code word length decoding means includes a prefix combination table for determining the combined length of N qualifying code words contained in said decoding window, and a word length table for determining the length of a leading code word contained in said decoding window.

18. The variable length decoder as set forth in claim 17, wherein said prefix combination table contains entries corresponding to all possible N-word combinations of the prefixes of the code words of a qualifying type.

19. The variable length decoder as set forth in claim 11, wherein said code word length decoding means includes a prefix combination table for determining the combined length of N qualifying code words contained in said decoding window, and a word length table for determining the length of a leading code word contained in said decoding window.

20. The variable length decoder as set forth in claim 19, wherein said prefix combination table contains entries corresponding to all possible combinations of the prefixes of the code words of a qualifying type.

21. The variable length deocoder as set forth in claim 11, wherein said computation loop means includes:
   a multiplexer which has a first input for receiving said leading word length signal, a second input for receiving said combined length signal, a control input for receiving a control signal indicative of whether or not said decoding window includes N qualifying code words, said multiplexer being responsive to said control signal for outputting either said leading word length signal or said combined length signal; and, adder-accumulator means responsive to either said leading word length signal or said combined length signal, whichever is outputted by said multiplexer, for producing said word pointer signal.

22. The variable length decoder as set forth in claim 21, further including control means for generating said control signal.

23. The variable length decoder as set forth in claim 11, wherein the input bit stream comprises an MPEG digital video bit stream.

24. The variable length decoder as set forth in claim 11, wherein said qualifying code words comprise code word types corresponding to payload data of an MPEG digital video bit stream.

25. The variable length decoder as set forth in claim 11, wherein the non-qualifying types of code words comprise code word types corresponding to setup data of an MPEG digital video bit stream..

26. The variable length decoder as set forth in claim 11, wherein said N qualifying code words comprises N contiguous code words of the qualifying type which belong to a common coding table.

27. A variable length decoder for processing an input bit stream which includes a plurality of qualifying and non-qualifying types of variable length code words, by two-word bit stream segmentation, comprising:

an input circuit for receiving the input bit stream and providing a sequence of available input bits;

a shifter circuit for providing a decoding window that includes one or more code words contained in said sequence of available input bits;

a code word length decoding circuit for determining whether or not said decoding window contains a pair of qualifying code words, and for determining the combined length of the pair of qualifying code words and producing a combined length signal representative of the determined combined length, if it is determined that said decoding window contains a pair of qualifying code words, and further, for determining the length of a leading code word contained in said decoding window and producing a leading word length signal representative of the determined length of the leading code word; and, a computation loop circuit for generating a word pointer signal, in response to either said combined length signal if it is determined that said decoding window contains a pair of qualifying code words, or otherwise, in response to said leading word length signal, said shifter circuit being responsive to said word pointer signal for shifting said decoding window across said sequence of available input bits.

28. The variable length decoder as set forth in claim 27, wherein the input bit stream comprises a Huffman-encoded bit stream which contains different types of variable length code words each of which includes a prefix which defines its bit length, wherein code words of the same type and same bit length, but having different values, have the same prefix.

29. The variable length decoder as set forth in claim 28, wherein said code word length decoding circuit includes a prefix combination table for determining the combined length of a pair of qualifying code words contained in said decoding window, and a word length table for determining the length of a leading code word contained in said decoding window.

30. The variable length decoder as set forth in claim 29, wherein said prefix combination table contains entries corresponding to all possible combinations of the prefixes of the code words of a qualifying type.

31. The variable length decoder as set forth in claim 27, wherein said code word length decoding circuit includes a prefix combination table for determining the combined length of a pair of qualifying code words contained in said decoding window, and a word length table for determining the length of a leading code word contained in said decoding window.

32. The variable length decoder as set forth in claim 31, wherein said prefix combination table contains entries corresponding to all possible combinations of the prefixes of the code words of a qualifying type.

33. The variable length decoder as set forth in claim 27, further including a code word value decoding circuit for decoding the values of said one or more code words contained in said decoding window.

34. The variable length deocoder as set forth in claim 27, wherein said computation loop circuit includes:

a multiplexer which has a first input for receiving said leading word length signal, a second input for receiving said combined length signal, a control input for receiving a control signal indicative of whether or not said decoding window includes a pair of qualifying code words, said multiplexer being responsive to said control signal for outputting either said leading word length signal or said combined length signal; and, an adder-accumulator circuit responsive to either said leading word length signal or said combined length signal, whichever is outputted by said multiplexer, for producing said word pointer signal.

35. The variable length decoder as set forth in claim 27, wherein the input bit stream comprises an MPEG digital video bit stream.

36. The variable length decoder as set forth in claim 27, wherein the qualifying types of code words comprise code word types corresponding to payload data of an MPEG digital video bit stream.

37. The variable length decoder as set forth in claim 27, wherein the non-qualifying types of code words comprise code word types corresponding to setup data of an MPEG digital video bit stream.

38. The variable length decoder as set forth in claim 27, wherein said pair of qualifying code words comprises a pair of contiguous code words of the qualifying type which belong to a common coding table, but which may have different lengths.

* * * * *